(12) United States Patent
Wang

(10) Patent No.: US 7,524,731 B2
(45) Date of Patent: Apr. 28, 2009

(54) PROCESS OF FORMING AN ELECTRONIC DEVICE INCLUDING AN INDUCTOR

(75) Inventor: James Jen-Ho Wang, Phoenix, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 101 days.

(21) Appl. No.: 11/540,614

(22) Filed: Sep. 29, 2006

(65) Prior Publication Data

US 2008/0079115 A1 Apr. 3, 2008

(51) Int. Cl.
*H01L 21/20* (2006.01)

(52) U.S. Cl. .................. 438/381; 438/622; 257/531; 257/E21.022

(58) Field of Classification Search .................. 438/381, 438/238, 329, 622, 623; 257/531, E21.022, 257/E23.141
See application file for complete search history.

(56) References Cited

U.S. PATENT DOCUMENTS

| | | | |
|---|---|---|---|
| 3,263,191 A | 7/1966 | Arvonio | |
| 3,614,554 A | 10/1971 | Shiekl et al. | |
| 4,103,267 A | 7/1978 | Olschewski | |
| 4,524,342 A | 6/1985 | Mas | |
| 4,806,895 A | 2/1989 | Petrow | |
| 5,140,706 A | 8/1992 | Maeda et al. | |
| 5,425,166 A | 6/1995 | Hastings et al. | |
| 5,425,167 A | 6/1995 | Shiga et al. | |
| 5,428,245 A | 6/1995 | Lin et al. | |
| 5,543,773 A | 8/1996 | Evans et al. | |
| 5,640,127 A | 6/1997 | Metz | |
| 5,767,563 A | 6/1998 | Imam et al. | |
| 5,886,393 A | 3/1999 | Merrill et al. | |
| 5,905,418 A | 5/1999 | Ehara et al. | |
| 5,945,880 A | 8/1999 | Souetinov | |
| 5,963,110 A | 10/1999 | Ihara et al. | |
| 6,194,774 B1 | 2/2001 | Cheon | |
| 6,303,423 B1 * | 10/2001 | Lin | 438/238 |
| 6,319,828 B1 | 11/2001 | Jeong et al. | |
| 6,417,755 B1 | 7/2002 | Liu et al. | |
| 6,427,315 B1 | 8/2002 | Kitagawa et al. | |
| 6,437,653 B1 | 8/2002 | Cruz et al. | |
| 6,452,473 B1 | 9/2002 | Suzuki et al. | |
| 6,456,183 B1 | 9/2002 | Basteres et al. | |
| 6,466,122 B1 | 10/2002 | Hasegawa et al. | |
| 6,472,257 B2 | 10/2002 | Ferrari et al. | |

(Continued)

FOREIGN PATENT DOCUMENTS

EP 1202296 A1 5/2002

OTHER PUBLICATIONS

Colclaser, Roy A.; "Microelectronics: Processing and Device Design"; John Wiley & Sons, Inc., 1980; pp. 166-171.

*Primary Examiner*—Tuan N. Quach

(57) ABSTRACT

An electronic device can include an inductor overlying a shock-absorbing layer. In one aspect, the electronic device can include a substrate, an interconnect level overlying the substrate, and the shock-absorbing layer overlying the interconnect level. The inductor can include conductive traces and looped wires. The conductive traces can be attached to the conductive traces over the shock-absorbing layer. In another aspect, a process can be used to form the electronic device including the inductor. In still another aspect, an electronic device can a toroidal-shaped inductor that includes linear inductor segments that are connected in series.

20 Claims, 8 Drawing Sheets

U.S. PATENT DOCUMENTS

| | | | |
|---|---|---|---|
| 6,478,975 B1 | 11/2002 | Ju | |
| 6,480,086 B1 | 11/2002 | Kluge et al. | |
| 6,480,087 B1 | 11/2002 | Oiwa et al. | |
| 6,483,413 B1 | 11/2002 | Maeda et al. | |
| 6,534,374 B2 * | 3/2003 | Johnson et al. | 438/381 |
| 6,548,365 B2 * | 4/2003 | Basteres et al. | 438/381 |
| 6,586,309 B1 | 7/2003 | Yeo et al. | |
| 6,600,208 B2 | 7/2003 | Brennan et al. | |
| 6,614,091 B1 | 9/2003 | Downey et al. | |
| 6,646,347 B2 | 11/2003 | Mercado et al. | |
| 6,790,759 B1 | 9/2004 | Wang et al. | |
| 6,800,534 B2 * | 10/2004 | Hsieh | 438/381 |
| 6,998,952 B2 | 2/2006 | Zhou et al. | |
| 7,061,072 B2 | 6/2006 | Blanchard et al. | |
| 7,410,894 B2 * | 8/2008 | Chinthakindi et al. | 438/612 |
| 2003/0031339 A1 | 2/2003 | Marshall et al. | |
| 2003/0041455 A1 | 3/2003 | Akhavain et al. | |
| 2005/0001324 A1 | 1/2005 | Dunn et al. | |
| 2005/0136558 A1 | 6/2005 | Wang et al. | |
| 2005/0167828 A1 | 8/2005 | Yeo et al. | |
| 2005/0285262 A1 | 12/2005 | Knapp et al. | |
| 2006/0012042 A1 | 1/2006 | Taggert et al. | |
| 2007/0267718 A1 * | 11/2007 | Lee | 257/531 |

* cited by examiner

PROCESS OF FORMING AN ELECTRONIC DEVICE INCLUDING AN INDUCTOR

BACKGROUND

1. Field of the Disclosure

The present disclosure relates to electronic devices and processes, and more particularly to electronic devices including inductors and processes of forming the same.

2. Description of the Related Art

Within electronic devices, the formation of transistors, diodes, capacitors, and resistors at least partly within a substrate is conventional. Electronic devices can include inductors, but problems can arise. Planar inductors are relatively easy to form but can possess characteristics that are undesired. When operating, the planar inductor can generate an electromagnetic flux that is substantially perpendicular to the major surface of the substrate. In an attempt to reduce adverse affects, a high resistivity substrate can be used. However, a high resistivity substrate is not as good an alternative because it affects the electrical properties of the transistors and resistors, and could result in unacceptable parasitic effects. As another alternative, a radio-frequency ("RF") shield can be used. The RF shield can be a solid sheet that reflects electromagnetic radiation but inductive cross coupling between the inductor and the solid metal sheet can induce eddie currents within the solid metal sheet and cause electrical loss into the RF reflecting solid metal sheet.

Non-planar inductors can be used. A non-planar inductor can include a plurality of spaced-apart conductive traces that are electrically connected by wire bonds. The spaced-apart conductive traces are formed at the same interconnect level as the bonding pads of the die that are wire bonded to conductive leads of a packaging substrate. Thus, the spaced-apart conductive traces are formed on an inorganic insulating layer that overlies other inorganic insulating layers and the die substrate. The conductive traces are about the same thickness as the bonding pads, which may be in a range of about 0.5 to 1 micron thick. Wires are then bonded to adjacent conductive traces. The bonds between the conductive traces and the wires are made over inorganic insulating layers. A wedge wire bond process used to form the non-planar inductor is believed to be adequate by many skilled artisans if bond pad thickness would be greater than 1 micron. However, a conventional ball wire bond process can damage the brittle, inorganic insulating layers underneath the secondary bond pads leading to yield loss and complex wirebond process control.

BRIEF DESCRIPTION OF THE DRAWINGS

Embodiments are illustrated by way of example and are not limited in the accompanying figures.

Figure 1:
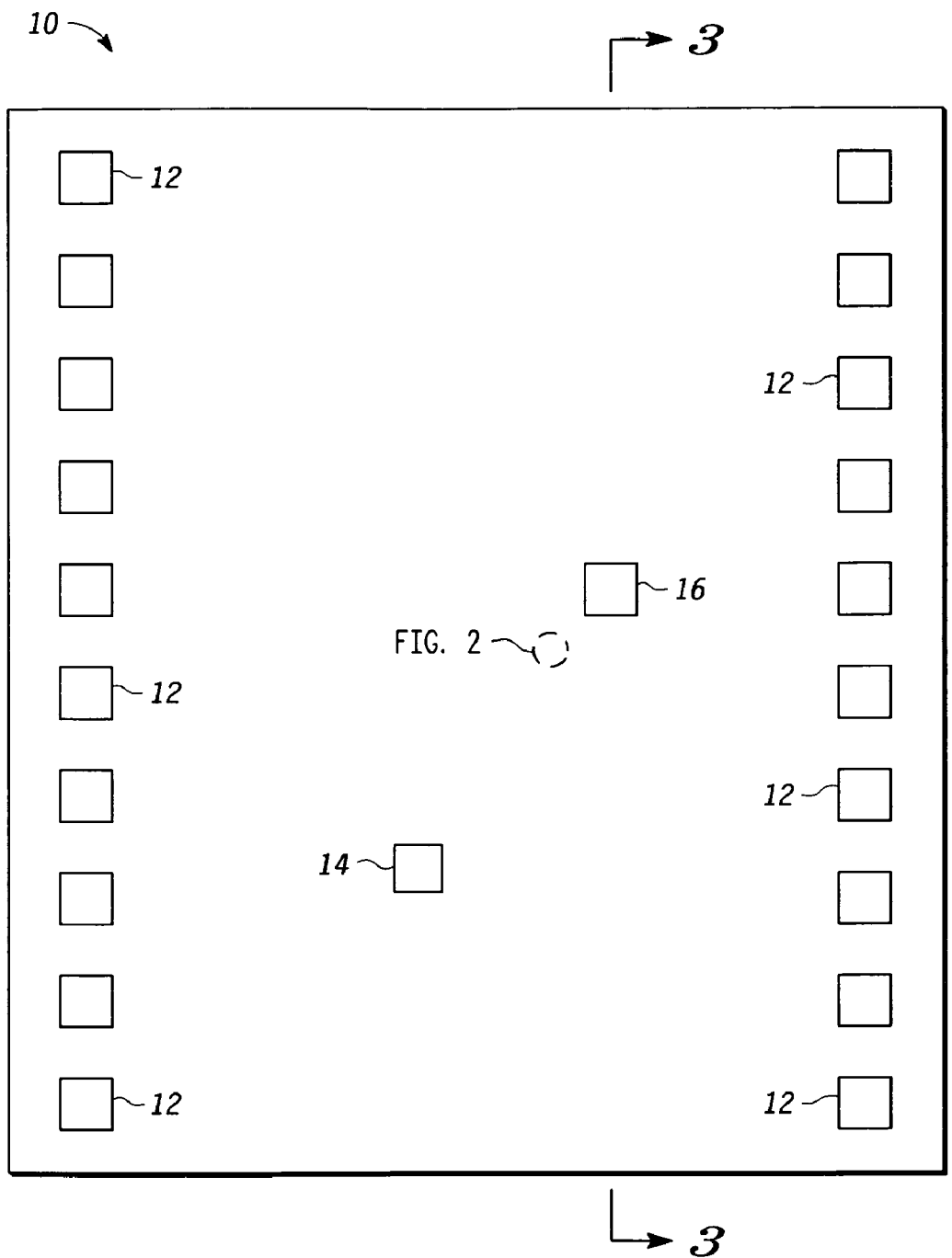
FIG. 1 includes an illustration of a top view of a workpiece after forming openings that expose bonding pads and interconnects.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

An electronic device can include an inductor overlying a shock-absorbing layer. In one aspect, the electronic device can include a substrate, an interconnect level overlying the substrate, and the shock-absorbing layer overlying the interconnect level. The interconnect level can include a first interconnect and a second interconnect, and the shock-absorbing layer can include a first opening over the first interconnect and a second opening over the second interconnect. The inductor can include conductive traces and at least one looped wire. The conductive traces can include a first conductive trace and a second conductive trace. A first via pad portion of the first conductive trace can extend to the first opening of the shock-absorbing layer and be electrically connected to the first interconnect, and a primary pad portion of the first conductive trace can overlie the shock-absorbing layer. A secondary pad portion of the second conductive trace can overlie the shock-absorbing layer, and a via portion of the second conductive trace can extend to the second opening of the shock-absorbing layer and be electrically connected to the second interconnect. A first looped wire of the at least one wire is attached to the primary pad portion of the first conductive trace. The first looped wire or a second looped wire of the at least one wire is attached to the secondary pad portion of the second conductive trace.

In still another second aspect, an electronic device can be a toroidal-shaped inductor that includes linear inductor segments that are connected in series.

Embodiments as described herein can be used to provide benefits that overcome the problems with conventional structures and processes. The shock-absorbing layer reduces the likelihood of damaging underlying electronic components and inorganic insulating layers during a wire-bond operation when forming an overlying inductor. Conductive traces for the inductor can be significantly thicker than the bonding pads and interconnects at levels below the passivation layer within the electronic device. The additional thickness, particularly of a malleable material, such as copper or gold, can further help in absorbing mechanical shock during a wire bonding operation and reduce the likelihood of fracturing underlying inorganic insulating layers. The thicker metal also reduces electrical resistance, carries higher current, and forms better inductors. The layout of the inductors can be oriented to allow for a faster wire-bond operation. None or fewer die rotations may be needed when performing the wire-bond operation.

Before addressing details of embodiments described below, some terms are defined or clarified. The term "bonding pads" is intended to regions of interconnects, or other conductive traces that are used as electrical connection points between a die and other conductors outside the dies (e.g., conductive leads of a packing substrate).

The term "die substrate" is intended to mean a base material for a die. An example of a die substrate includes a quartz plate, a monocrystalline semiconductor wafer, a semiconductor-on-insulator wafer, etc.

The term "linear inductor" is intended to mean an inductor that includes conductive traces, wherein the lengths of the conductive traces are substantially parallel to one another, and the lengths of the wires are substantially parallel to one another, or both. The term "linear inductor segment" is intended to mean a portion of an inductor, not necessarily a linear inductor, wherein such portion includes conductive traces having the lengths that are substantially parallel to one another, and the looped wires are substantially parallel to one another and in line with bond pad orientation.

The term "major surface" is intended to mean a surface of a substrate or a layer overlying the substrate or a portion of the substrate or layer from which a transistor is subsequently formed. The major surface may be an original surface of a base material before forming any electronic components or may be a surface of the semiconductor layer that overlies the base material. For example, an exposed surface of a semiconductor layer of a semiconductor-on-insulator substrate can be a major surface, and not the original surface of the base material.

The term "organic," when referring to a layer or material, is intended to mean such layer or material principally includes molecules having carbon, hydrogen, and potentially another element, such as nitrogen, oxygen, sulfur, or the like. For the purposes of this specification, organic and inorganic are mutually exclusive with respect to a layer or material. For example, if a layer in not organic, the layer is inorganic. An example of an inorganic layer is a carbon-doped silicon dioxide layer, as the layer principally includes $SiO_2$ molecules.

The term "packaging substrate" is intended to mean a substrate of an electronic device used to protect a die and provide electrical connections between the die and a location external to the electronic device. A packaging substrate can include a lead frame or other conductive traces used for routing voltages or signals to or from the die.

The term "passivation layer" is intended to mean an inorganic layer that is formed after forming an interconnect level having bonding pads for an electronic device. The bonding pads are not part of the passivation layer, itself.

The term "pitch" is intended to mean a sum of a width of a feature and a space between two adjacent features at the substantially the same level or elevation within an electronic device.

The term "primary bond," when referring a wire-bonding operation, is intended to mean the first bond formed between a wire and at a bonding region, and the term "secondary bond," when referring the wire-bonding operation, is intended to mean the second bond formed between the wire and a different bonding region (i.e., after forming the primary bond). In a conventional wire-bonding operation for an integrated circuit, the primary bonds are bonded to bonding pads of a die, and the secondary bonds are bonded to conductive traces (e.g., leads) of a packaging substrate.

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B is true (or present).

Unless otherwise defined, all technical and scientific terms used herein have the same meaning as commonly understood by one of ordinary skill in the art to which this invention belongs. All publications, patent applications, patent, and other references mentioned herein are incorporated by reference in their entirety. In case of conflict, the present specification, including definitions, will control. In addition, the materials, methods, and examples are illustrative only and not intended to be limiting.

Other features and advantages of the invention will be apparent from the following detailed description, and from the claims.

To the extent not described herein, many details regarding specific materials, processing acts, and circuits are conventional and may be found in textbooks and other sources within the semiconductor and microelectronic arts.

Figure 2:
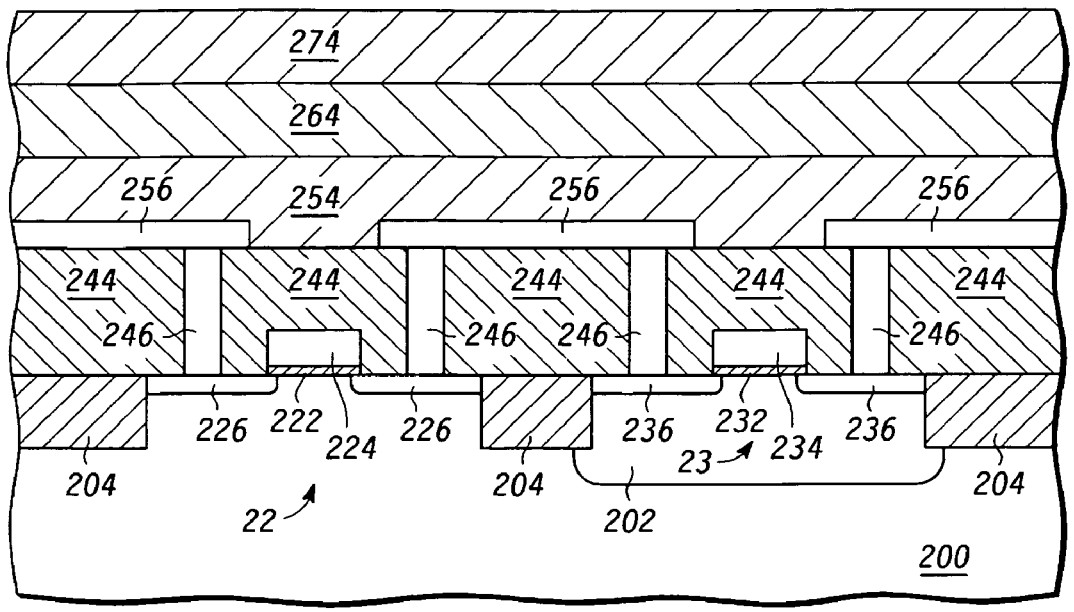
FIG. 2 includes an illustration of a cross-sectional view of the workpiece of FIG. 1 at the location indicated by the dashed circle in FIG. 1.
Figure 3:
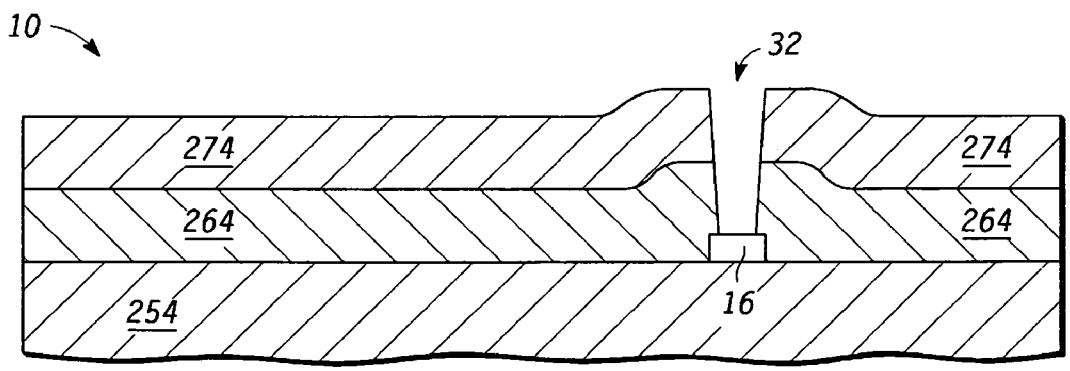
FIG. 3 includes an illustration of a cross-sectional view of the workpiece of FIG. 1 along sectioning line 3-3 in FIG. 1.

FIGS. 1 to 3 include illustrations of a die 10 after forming an inorganic passivation layer and a shock-absorbing layer. FIG. 1 includes a top view, FIG. 2 includes a cross-sectional view of a portion of the die 10, as illustrated by the dashed circle in FIG. 1, and FIG. 3 includes a cross-sectional view along sectioning line 3-3 in FIG. 1.

FIG. 1 illustrates the positional relationships between bonding pads 12, an interconnect 14, and an interconnect 16. The bonding pads 12 will be subsequently electrically connected to a lead frame or other conductive traces of a packaging substrate (not illustrated in FIG. 1). The interconnect 14 and the interconnect 16 provide electrical connections for a subsequently-formed inductor. Other interconnects can be present but are not illustrated in FIG. 1. Other than a subsequently-formed inductor, a final interconnect level of the die 10 includes the bonding pads 12, the interconnection 14, the interconnect 16, and potentially the other interconnects (not illustrated in FIG. 1). Each of the bonding pads 12, the interconnect 14, and the interconnect 16 are electrically connected to electronic components (e.g., transistors, resistors, capacitors, or any combination thereof) within the die 10.

FIG. 2 illustrates a portion of the die 10 including a die substrate 200 having a well region 202 and field isolation regions 204 formed therein. In one embodiment, the die substrate 200 can include an electronic device substrate, such as a flat panel substrate, a semiconductor device substrate, or another conventional substrate used for forming electronic devices. In one particular embodiment, the die substrate 200 can include a bulk semiconductor wafer (illustrated in FIG. 2) or a semiconductor-on-insulator substrate (not illustrated). In another particular embodiment, the die substrate 200 may have a resistivity no greater than approximately 14 ohm-cm. In a further particular embodiment, the die substrate 200 and the well region 202 have opposite conductivity types. The field isolation regions 204 help to electrically insulate electronic components, such as a transistor 22 and a transistor 23, from one another.

As illustrated in the embodiment of FIG. 2, each of the transistor 22 and the transistor 23 includes a gate dielectric layer (222, 232), a gate electrode (224, 234), and doped regions (226, 236). The doped regions can act as source/drain regions for the transistors 22 and 23. Other possible electronic components, including resistors, diodes, capacitors, other transistors, a microelectronic mechanical system, opto-electronics, a compound semiconductor device, or any combination thereof, may be present but are not illustrated in FIG. 2. The die 10 also includes an insulating layer 244, contact plugs 246, another insulating layer 254, interconnects 256, a passivation layer 264, and a shock-absorbing layer 274.

The materials and formation of die 10 through formation of the passivation layer 264 are conventional or proprietary. Any of the insulating layers and the passivation layer 264 can be inorganic and include silicon dioxide, silicon nitride, silicon oxynitride, or the like. Any of the insulating layers and the passivation layer 264 may or may not be doped with boron, phosphorous, carbon, fluorine, another suitable dopant for an insulating layer, or any combination thereof. Note that a carbon-doped silicon dioxide layer is considered an inorganic layer for the purposes of this specification because the layer is principally silicon dioxide. Any of the insulating layers and the passivation layer 264 can include one film or more than one film. When the insulating layers and the passivation layer 264 are inorganic layers, they are relatively brittle and easy to fracture, particularly if any of the insulating layers includes voids (e.g., to lower the dielectric constant of the insulating layer).

FIG. 3 includes an illustration of a cross-sectional view that includes the interconnect 16. To simplify understanding, only the insulating layer 254 and higher points of the die 10 (farther from the major surface of the die substrate 200) are illustrated. Referring to FIG. 3, the passivation layer 264 is formed over insulating layer 254 and the final interconnect level, including the interconnect 16. The passivation layer 264 can act as a moisture and mobile-ion barrier for the die 10, and thus, the passivation layer 264 is an inorganic layer. In one embodiment, the passivation layer 264 includes a layer of chemically vapor deposited (CVD) silicon nitride overlying a film of CVD phosphosilicate glass (PSG) overlying a plasma enhanced CVD silicon dioxide hard mask film. The passivation layer 264 has a thickness in a range of approximately 300 to 900 nanometers. In another embodiment, the passivation layer 264 can include a single film or a different combination of films, wherein each of the films may have a composition that is the same or different or may have the same or different thicknesses, as compared to the particular embodiment previously described. The passivation layer 264 is patterned using conventional or proprietary lithographic process to define passivation openings that expose portions of the bonding pads 12 (not illustrated in FIG. 3), the interconnect 14 (not illustrated in FIG. 3), and the interconnect 16 in FIG. 3.

The shock-absorbing layer 274 is formed over the passivation layer 264, the bonding pads 12, the interconnect 14, and the interconnect 16. The shock-absorbing layer 274 can be an organic layer capable of being subjected to subsequent thermal cycles used in wire bonding or other packaging operations (e.g., solder reflow, die bonding, etc.). The shock-absorbing layer 274 has a Young's modulus of elasticity less than (i.e., more elastic than) the passivation layer 264, and potentially, any or all of the other underlying insulating layers (e.g., the insulating layer 244 or the insulating layer 254). In one embodiment, the shock-absorbing layer 274 can include polyimide, polyamide, benzocyclobutene, polybenzoxazole, another suitable organic polymer material, or any combination thereof.

The shock-absorbing layer 274 can be formed by depositing (e.g., coating) a layer of an appropriate material. The shock-absorbing layer 274 should have a thickness sufficient to absorb shock and reduce the likelihood of fracturing the passivation layer 264 or underlying insulating layers during a subsequent wire-bond operation when forming an inductor.

In one embodiment, the thickness of the shock-absorbing layer 274 is at least approximately 1 µm, and in another embodiment, is at least approximately 3 µm. While no upper theoretical limit is known for the shock-absorbing layer 274, practical limits may be determined by manufacturing constraints. For example, if the shock-absorbing layer 274 is too thick, patterning the shock-absorbing layer 274 or making electrical connections through openings within the shock-absorbing layer 274 can become difficult. In one embodiment, the shock-absorbing layer 274 has a thickness no greater than approximately 9 µm, and in another embodiment, no greater than approximately 5 µm after cure.

In a particular embodiment, the shock-absorbing layer 274 includes a photo-imageable layer of polyimide coated using a conventional or proprietary spin-on process. The polyimide layer can be developed or etched using conventional or proprietary processing to define openings, such as opening 32, through which electrical connections to the bonding pads 12, the interconnect 14, and the interconnect 16 will be subsequently made. If necessary or desired, the shock-absorbing layer 274 can be cured at a temperature up to approximately 350 degrees Celsius to release a volatile organic component, moisture, or any combination thereof. An optional plasma ashing process can be used to remove organic residue from the exposed surfaces of the bonding pads 12, the interconnect 14, and the interconnect 16 and roughen the exposed surface of the shock-absorbing layer 274.

Figure 4:
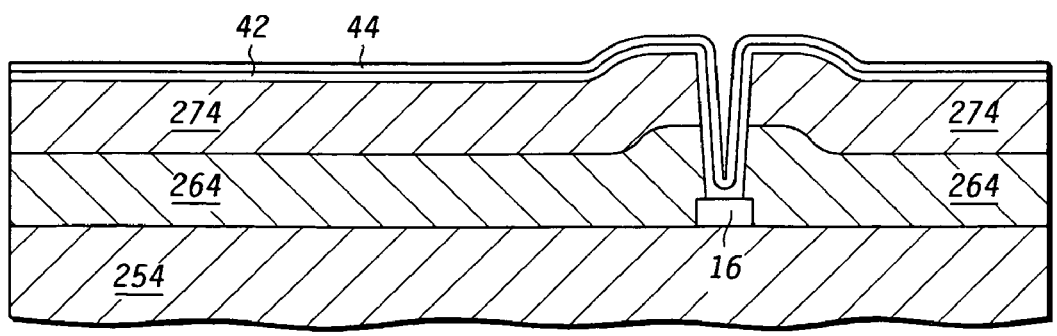
FIG. 4 includes an illustration of a cross-sectional view of the workpiece of FIG. 3 after forming an adhesion/barrier layer and a seed layer.

The process sequence of forming conductive traces for an inductor can begin. FIG. 4 includes a cross-sectional view of the workpiece after forming an adhesion/barrier layer 42 and a seed layer 44 over the shock-absorbing layer 274. In one embodiment, the workpiece is first sputter cleaned followed by the deposition of the adhesion/barrier layer 42 using a conventional sputtering deposition method. In one embodiment, the adhesion/barrier layer 42 includes a layer of titanium tungsten having a thickness in a range of approximately 150 to approximately 350 nm. In another embodiment, the adhesion/barrier layer 42 includes titanium, titanium nitride, nickel vanadium, chromium, or any combination thereof. The seed layer 44 is deposited over the adhesion/barrier layer 42. In one embodiment, the seed layer 44 includes a layer of sputter deposited gold having a thickness in a range of approximately 150 to approximately 600 nm. In another embodiment, another thickness for the adhesion/barrier layer 42, the seed layer 44, or both may be thicker or thinner than the exemplary ranges. In still another embodiment, another conductive metal, such as copper, which may include alloying elements, such as magnesium, indium, tin, chromium, zinc, silver, zirconium, palladium, titanium, iron, niobium, magnesium, or the like, can be used as the seed layer 44. In one embodiment, the sputter preclean, the adhesion/barrier layer 42 deposition, and the seed layer 44 deposition are all sequentially performed inside the same processing tool, although this is not a requirement. Depending on the period of time between the final processing when forming the shock-absorbing layer 274, as patterned, and formation of adhesion/barrier layer 42 and seed layer 44, a dehydration bake step can be incorporated to remove absorbed moisture from the shock-absorbing layer 274 to reduce the likelihood of the conductive traces subsequently delaminating from the shock-absorbing layer 274.

Figure 5:
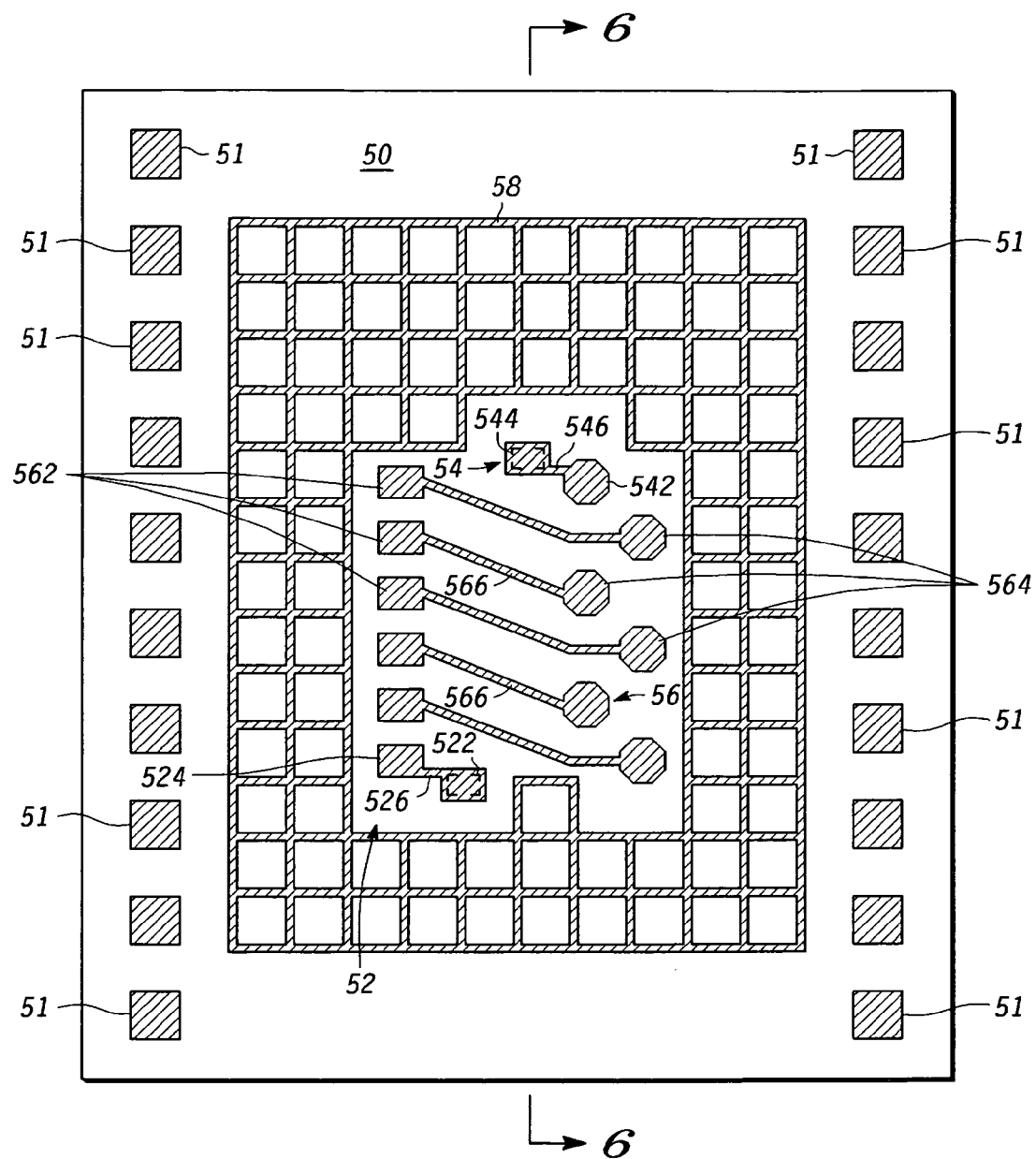
FIGS. 5 and 6 include illustrations of a top view and a cross-sectional view, respectively, of the workpiece of FIG. 4 after forming a patterned layer over the seed layer and forming the conductive layer within openings of the patterned layer.
Figure 6:
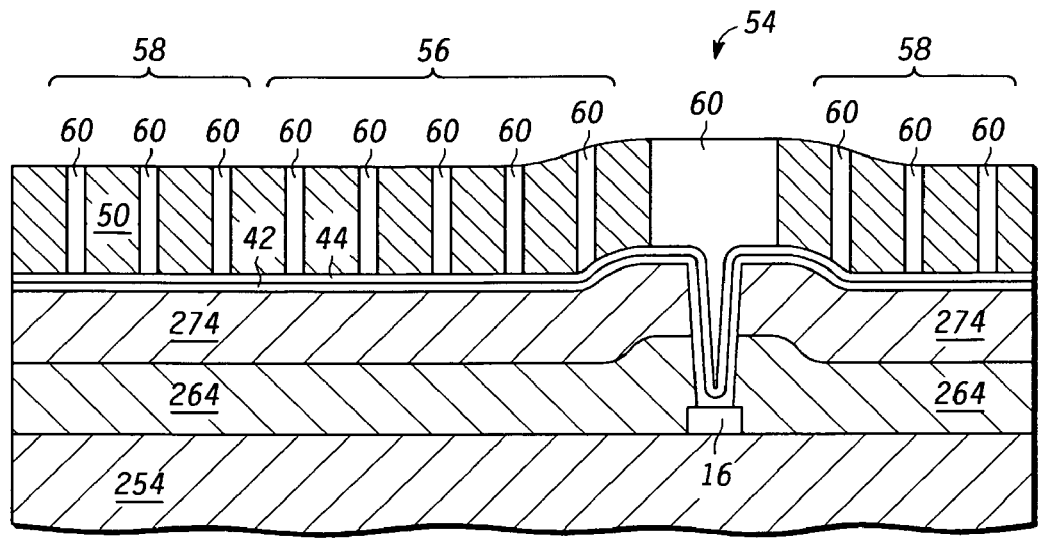

FIGS. 5 and 6 include illustrations of a top view and a cross-sectional view, respectively, of the workpiece after forming a patterned layer 50 and forming a conductive layer 60 within the openings of the patterned layer for conductive pads 51, a conductive trace 52, a conductive trace 54, conductive traces 56 and a radio-frequency ("RF") shielding element 58. The patterned layer 50 includes openings that corresponds to the pattern of (i) the conductive pads 51 (overlying the bonding pads 12, not illustrated in FIG. 5), (ii) the conductive trace 52, (iii) the conductive trace 54, (iv) the conductive traces 56 that are intermediate with respect to the conductive traces 52 and 54, and (v) conductive traces that are part of the RF shielding element 58.

The conductive pads 51 are relatively thicker than the underlying bonding pads 12 (not illustrated in FIG. 5) and can include a malleable material. The malleable material and increased thickness of the conductive pads 51 help to reduce damage to underlying layers when wires are subsequently bonded to the conductive pads 51. In another embodiment (not illustrated), the patterned layer 50 may cover the bonding pads 12, in which case, the conductive pads 51 are not formed.

As illustrated, the conductive trace 52 includes a via portion 522, a primary pad portion 524, and an intermediate portion 526; the conductive trace 54 includes a secondary pad portion 542, a via portion 544, and an intermediate portion 546; and the conductive traces 56 includes primary pad portions 562, secondary pad portions 564, and intermediate portions 566. In one embodiment, the intermediate portions are buses between the different pad portions of the same conductive trace. The intermediate portions may be narrower, as wide, or wider than their corresponding primary and secondary pad portions.

The via portion 522 of the conductive trace 52 is electrically connected to the interconnect 14 (illustrated in FIG. 5 by a dashed line), and the primary pad portion 524 of the conductive trace 52 overlies the shock-absorbing layer 274. The secondary portion 542 of the conductive trace 54 overlies the shock-absorbing layer 274, and the via portion 544 of the conductive trace 54 is electrically connected to the interconnect 16 (illustrated in FIG. 5 by a dashed line). The conductive trace 52 and the conductive trace 54 offset the electrical connections of the inductor so that subsequently attached wires are not bonded directly over the interconnect 14 and the interconnect 16. In a particular embodiment, all subsequently-formed bonds for the inductor during a wire-bonding operation can be made over the shock-absorbing layer 274, rather than directly over the interconnect 14 and the interconnect 16 or directly on the passivation layer 264.

As illustrated in the embodiment of FIG. 5, the lengths of the conductive traces 56 are substantially parallel to one another. In one embodiment, the lengths of the conductive traces 56 are angled (with respect to the edges of the die 10) to allow for straight and easier wire bonding, which will be described later in this specification. The intermediate portions 566 may be narrower, the same width, or wider than the primary pad portions 562 and the secondary pad portions 564. In one embodiment, the secondary pad portions 564 are larger than the primary pad portions 562, and in a particular embodiment, the secondary pad portions 564 occupy at least 10% more area than the primary pad portions 562. In another embodiment, the primary pad portions 562 may be occupy the same or more area than the secondary pad portions 564.

From a top view, the primary pad portions 562 and the secondary pad portions 564 can be rectilinear (e.g., square or rectangular), hexagonal, octagonal, circular, oval, ellipsoidal, or the like. In a particular embodiment, the secondary pad portions 564 are octagonal, and the primary pad portions 562 are not octagonal. For example, the shape of the primary pad portions 562 can be rectangular and can be oriented to be in line with the secondary pad portions 564. The relative orientation of the primary pad portions 562 as being in line with the secondary pad portions 564 allow for easier bonder set-up, fewer bond defects (as electrical shorts between subsequently-formed wires and adjacent pads), plus faster wire bonding times. In another embodiment, the primary pad portions 562 and secondary pad portions 564 can be square (easier to layout), octagonal (approximating circular pad shape), circular, or any combination thereof. Staggering the secondary pad portions 564 results in different wire lengths for the conductive traces 56 but may reduce the wire pitch.

In a particular embodiment, the secondary pad portions 564 are octagonal, and the primary pad portions have a different shape, such as a square. In one embodiment, all of the conductive traces 56 overlie the shock-absorbing layer 274, and in a particular embodiment, lie on and contact the shock-absorbing layer 274. From a top view of the conductive traces 56, the primary pad portions 562 that are oriented along a substantially straight line, and secondary pad portions 564 that are oriented in a staggered formation. The layout can allow for different sized pad portions to be used. For example, in FIG. 5, the pitches for the primary and secondary pad portions can be substantially the same (e.g., approximately 50 μm for approximately 20 μm diameter wires); however, the primary pad portions 562 may be smaller than the secondary pad portions 564. In a particular embodiment, a pitch of approximately 54 μm may be used for subsequently bonded wires having a diameter of approximately 21 μm. After reading this specification, skilled artisans will appreciate that the pitches and feature sizes for the primary and secondary pad portions may be a function of the width of the subsequently-formed wires.

The RF shielding element 58 can electrically float or be electrically connected to a substantially constant voltage source. In the embodiment as illustrated in FIG. 5, the RF shielding element 58 is in the shape of a grid having spaces that are no greater than approximately ¼ of the designed operating wavelength of the RF signals, noise, or a combination thereof. For example, if the RF shielding element 58 is designed to operate at approximately 1 GHz, then the pitch of the grid is approximately 100 μm, and if the RF shielding element 58 is designed to operate at approximately 10 GHz, then the pitch of the grid is approximately 10 μm. In another embodiment, the spaces can be smaller than approximately ¼ of the operating wavelength, even down to ¹⁄₁₀₀₀ of the operating wavelength. The significance of the grid will be explained later in this specification. In still other embodiments, the RF shielding element 58 may be a substantially solid sheet (not illustrated) having a shape covering most of the die surface not required for the bonding pads 12 or the inductor being formed. In still another embodiment (not illustrated), the RF shielding element 58 does not have to be a single piece of material. For example, the RF shielding element could include spaced-apart strips, a plurality of spaced-apart grids, have other shapes (as described in another embodiment later in this specification), or any combination thereof. In a further embodiment, the RF shielding element 58 can be segmented and can be as efficient as a solid metal sheet to reflect electromagnetic noises. Unlike a solid metal sheet, a segmented grid can result in 1) a shorter plating time plus a lower cost to electroplate less material (e.g., gold) on die surface, and 2) less inductive loss that would occur from cross-coupling of inductor creating eddie current within continuous metal sheets, thus resulting in lower Q inductors. Additional RF shielding using an interconnect layer can be in the form of a solid plate, a segmented plate, or patterned grid directly underneath the inductor (including the conductive traces 52, 54, and 56) may be incorporated to form additional electrical field shielding.

Attention is now directed to forming the conductive pads 51, the conductive traces 52, 54, 56, and the RF shielding element 58. The patterned layer 50 acts as a template corresponding to the shapes of the conductive pads 51, the conductive traces 52, 54, 56, and the RF shielding element 58. In one embodiment, the patterned layer 50 includes a resist layer overlying the seed layer 44. The resist layer is as thick or thicker than a subsequently deposited metal film. The resist layer can have a thickness is in a range of approximately 2 to 50 µm. In a particular embodiment, the resist layer may include one or more radiation imageable films, and the resist layer has a thickness in a range of approximately 4 to 40 µm. In another embodiment, a different material may be used. For example, the patterned layer can include an inorganic insulating material, such as undensified CVD or PVD glass. A conventional or proprietary patterning process can be used to define the openings corresponding to the conductive pads 51, conductive traces 52, 54, 56, and the RF shielding element. At this point in the process, the patterned layer 50 has been formed. Portions of the seed layer 44 are exposed along the bottom surfaces of the openings within the patterned layer 50.

A conductive layer 60 is formed within the openings in the patterned layer 50 and over the seed layer 44, as illustrated in FIG. 6. The thickness of the conductive layer 60 may be varied. In theory, there are no limits on the thickness of the conductive layer 60; however, practical considerations may be used in determining the thickness. When electrical properties are considered, the conductive layer 60 can have a thickness of at least approximately 1 µm, at least approximately 2 µm, at least approximately 4 µm, or greater. In a particular embodiment, the conductive layer 60 is thicker than the bonding pads 12, the interconnect 14, and the interconnect 16.

Processing considerations may provide a practical upper limit on the thickness of the conductive layer 60. The conductive layer 60 should not be so thick that any two different conductive structures (i.e., any two or more of the conductive pads 51, conductive traces 52, 54, 56, or the RF shielding element 58) are electrically shorted to each other. Therefore, the conductive layer 60 should not have a thickness greater than the thickness of the patterned layer 50. Thus, the thickness of the conductive layer 60 can be limited by how thick the patterned layer 50 can be formed. In another embodiment, the thickness of the conductive layer 60 may be no greater than approximately 30 µm, no greater than approximately 20 µm, or thinner. In a particular embodiment, the conductive layer has a thickness in a range of approximately 4 to approximately 16 µm.

In one embodiment, the conductive layer 60 is a gold film deposited using a conventional electroplating process. Alternatively, electroless plating may be used to deposit the conductive layer 60. The conductive layer 60 may alternatively be formed using copper, or may include alloying elements, such as magnesium, indium, tin, chromium, zinc, silver, zirconium, palladium, titanium, iron, niobium, magnesium, or the like. In yet another embodiment, the conductive layer 60 may include a plurality of conductive films, such as copper/nickel/gold, copper/nickel/palladium, or combinations thereof.

Figure 7:
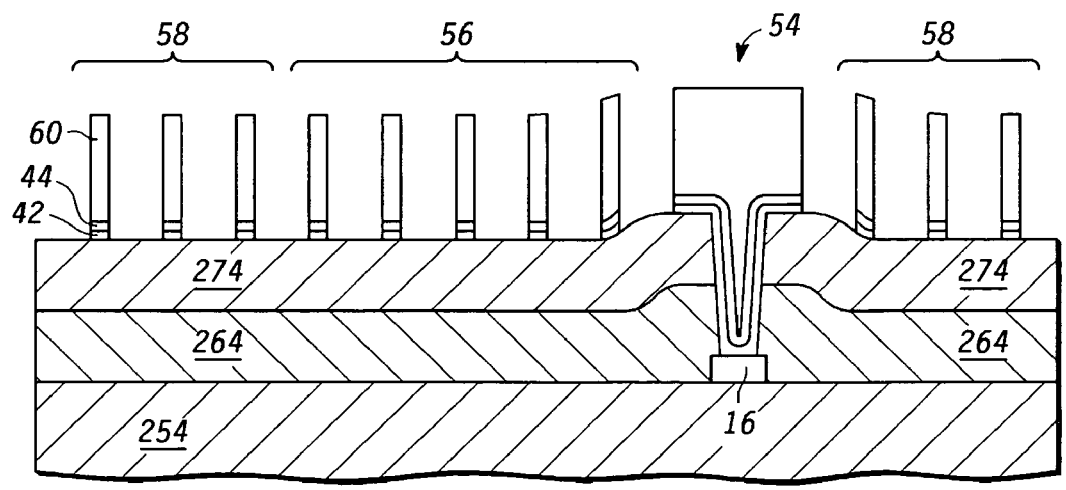
FIG. 7 includes an illustration of a cross-sectional view of the workpiece of FIG. 6 after removing the patterned layer and removing exposed portions of the seed and barrier layers.

FIG. 7 includes an illustration of a cross-sectional view of the electronic device after forming the conductive pads 51, conductive traces 52, 54, 56, and the RF shielding element 58. The patterned layer 50 (not illustrated in FIG. 7), exposed portions of the seed layer 44, and underlying portions of the adhesion/barrier layer 42 are removed. The patterned layer 50 can be removed using conventional or proprietary resist stripping processes. For example, using an oxygen-containing plasma ash process or a wet chemical process. The exposed portions of seed layer 44 is removed with a potassium iodide gold etchant using a spray acid tool or, alternatively, in an agitated bath. Exposed portions of adhesion/barrier layer 42 can then be stripped using hot hydrogen peroxide. The removal process can be tailored to the actual materials used. In one embodiment, an optional oxygen-containing ash processing step can be incorporated to clean exposed surfaces of the shock-absorbing layer 274 to reduce the likelihood of an electrical short or a leakage path between any of the conductive pads 51, conductive traces 52, 54, 56, and the RF shielding element 58.

Other embodiments may be used in forming the conductive pads 51, the conductive traces 52, 54, 56, and the RF shielding element 58. Other exemplary, non-limiting embodiments are described in U.S. Pat. No. 6,646,347.

Figure 8:
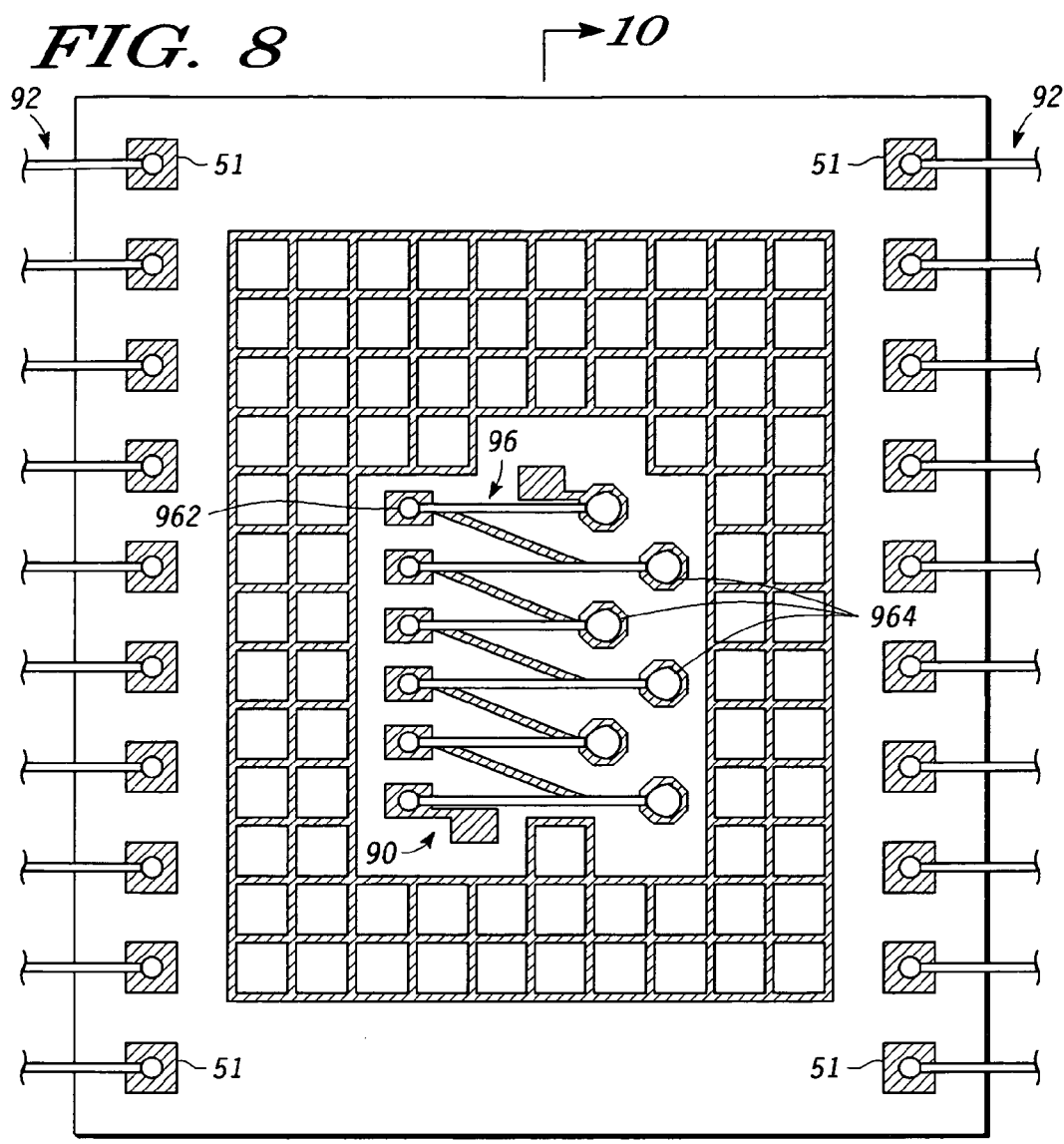
FIG. 8 includes an illustration of a top view of the workpiece of FIG. 7 after attaching wires.
Figure 9:
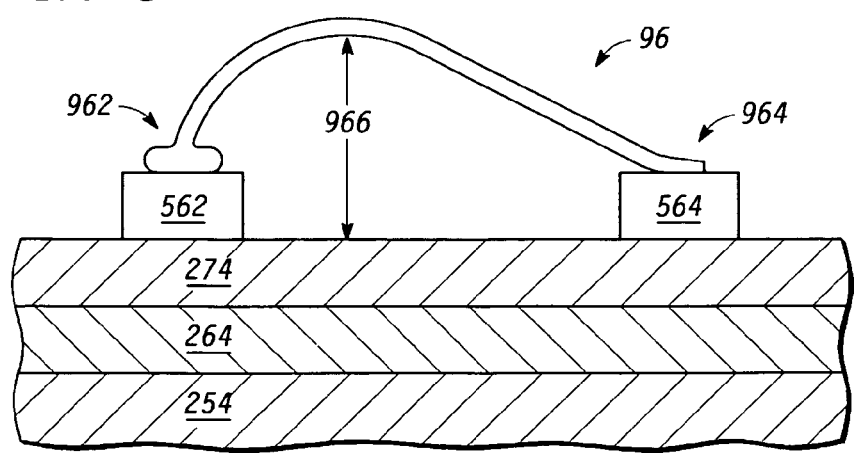
FIG. 9 includes an illustration of a cross-sectional view of a wire bonded onto a primary pad portion and a secondary pad portion.
Figure 10:
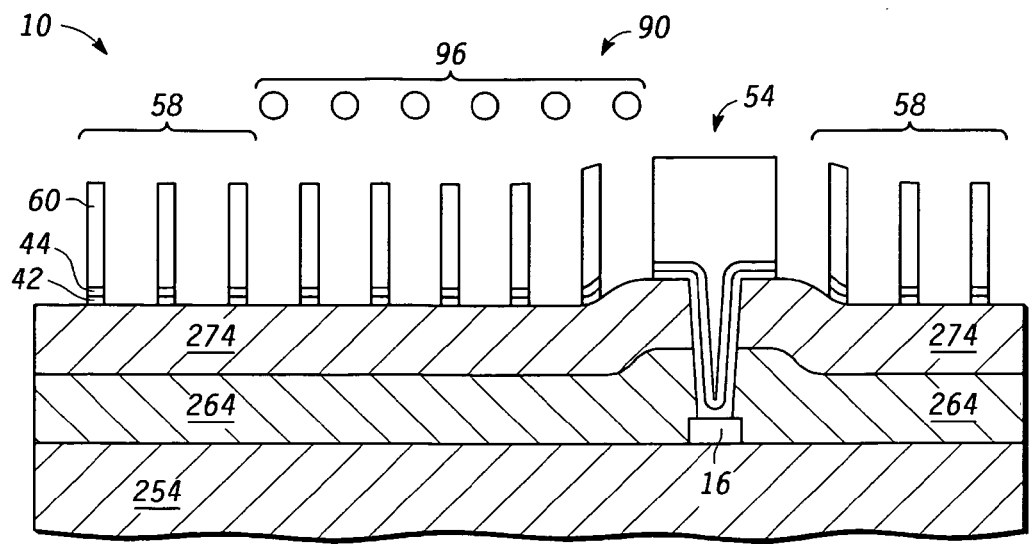
FIG. 10 includes an illustration of a cross-sectional view of the workpiece of FIG. 8 along sectioning line 10-10 in FIG. 8.

FIGS. 8, 9 and 10 include illustrations of a top view and cross-sectional views of the die 10 after wires 92 are attached between the conductive pads 51 and a lead frame of a package substrate (not illustrated), and after wires 96 are attached between the primary pad portions and secondary pad portions of adjacent conductive traces. The combination of the conductive traces 52, 54, and 56 and the wires 96 form an inductor 90.

FIG. 9 includes a cross-sectional view of a wire 96 that is wire bonded to a primary pad portion 562 and a secondary pad portion 564 of adjacent conductive traces 56. The wire 96 includes a primary bond 962 that is bonded to the primary pad portion 562 and a secondary bond 964 that is bonded to the secondary pad portion 564. In one embodiment, the wires 96 can be looped and include intermediate portions that are spaced apart from the exposed surfaces of the conductive traces 56 and the shock-absorbing layer 274. A dimension 966 is a measure of the maximum distance between a particular wire 96 and the surface of the shock-absorbing layer 274. As the dimension 966 increases, a larger inductor value is realized. To achieve higher value inductors, taller wire loops that would still fit within the mold compound of a package are desirable. Furthermore, the control of wire bond loop height (i.e., dimension 966) and its shape affect the inductor value of the inductor 90.

FIG. 10 includes a cross-sectional view of the die 10 at sectioning line 10-10 in FIG. 8 to illustrate spatial relationships. As illustrated, the inductor 90 is a non-planar, linear inductor and occupies an area of approximately 350 µm×350 µm. In another embodiment, the inductor 90 may occupy less area or more area of the die 10.

The wires 92 and the wires 96 can be attached using a conventional or proprietary wire bonding process. The wire bonding can include ball bonding, wedge bonding, another wire bonding technique, or any combination thereof. As illustrated in the embodiment in FIGS. 8 to 10, ball bonding is used. Each of the wires 92 and the wires 96 includes a primary bond and a secondary bond. The primary bond is the first bond of a wire that is formed, and the secondary bond is the second bond of the same wire. Forming the primary bond and secondary bond involves heat, force, and ultrasonic scrubbing (stress) that is received by the die 10. Forming the secondary bonds can involve significantly more mechanical force and stress as compared to the primary bonds.

The wires 92 have primary bonds at the conductive pads 51 and secondary bonds at the package substrate (not illustrated). Further the conductive pads 51 may not overlie other interconnects or electrical components (e.g., transistors) formed along the major surface of the die substrate 200.

The shock-absorbing layer 274 and relatively thicker the conductive traces 52, 54, and 56 (as compared to the interconnect 14 and the interconnect 16) help to dissipate mechanical force and stress and allow both the primary and second bonds for the wires 96 to be formed over underlying interconnects and electronic components with a reduced likelihood of damaging the underlying interconnects and electronic components. The primary bonds 962 for the wires 96 of the inductor 90 are made at locations closer to the center of the die 10 as compared to the wires 92, which are closer to the edges of the die 10. Also, unlike wires 92, the secondary bonds 964 of the wires 96 are made over the die substrate 200.

Figure 11:
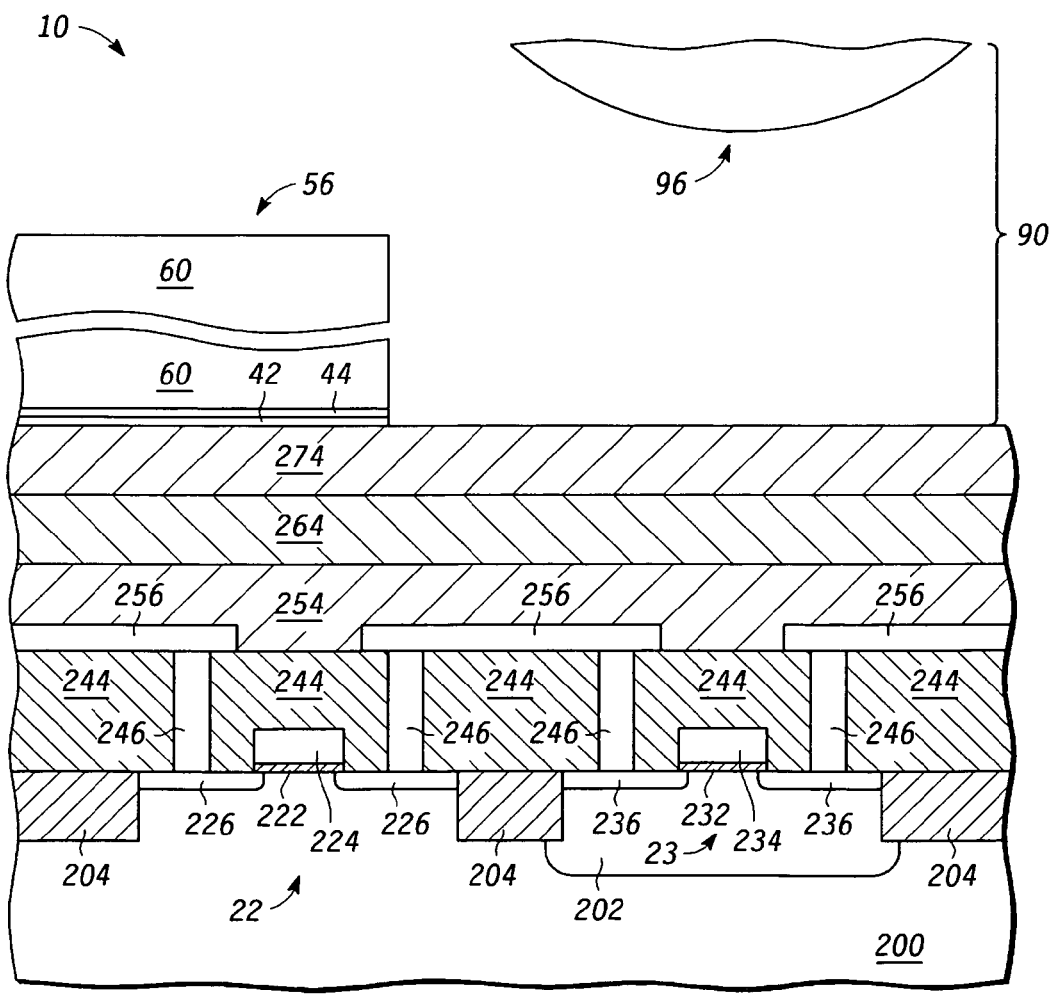
FIG. 11 includes an illustration of a cross-sectional view of the workpiece of FIG. 10 at the location in FIG. 2, after forming a non-planar inductor.

FIG. 11 includes an illustration of a cross-sectional view of a portion of the electronic device to illustrate the positional relationships between the inductor 90, including the conductive trace 56 and the wire 96, and the transistor 22, the transistor 23, and the interconnects 256 at substantially the same location as illustrated in FIG. 2. Note that FIG. 11 is not drawn to scale, as the gate electrode 224 of the transistor 22 and the gate electrode 234 of the transistor 23 may be less than approximately 1 µm wide, and the conductive trace 56 and the wire 96 may be up to approximately 200 µm (approximately 8 mils) apart. The inductor 90 includes the conductive trace 56 and the wire 96, and therefore, the inductor 90 overlies electronic components (e.g., the transistor 22 and the transistor 23) and the interconnects 256 that are electrically connected to the electronic components.

If needed or desired, in order to reduce the electromagnetic radiation reaching the electronic components and interconnects, the RF shielding element 58 may be formed at a different level as compared to the conductive traces 52, 54, and 56. For example, the RF shielding element 58 could be formed at the same interconnect level the bonding pads 12, the interconnect 14, and the interconnect 16. The RF shielding element 58 may lie between the inductor 90 and the underlying electronic components and the interconnects 256. In another embodiment, another RF shielding element (not illustrated) may lie may lie between the inductor 90 and the underlying electronic components and the interconnects 256, and be used in conjunction with the RF shielding element 58. In another embodiment, a substantially solid sheet of a conductor (as opposed to a grid) can be used.

Figure 12:
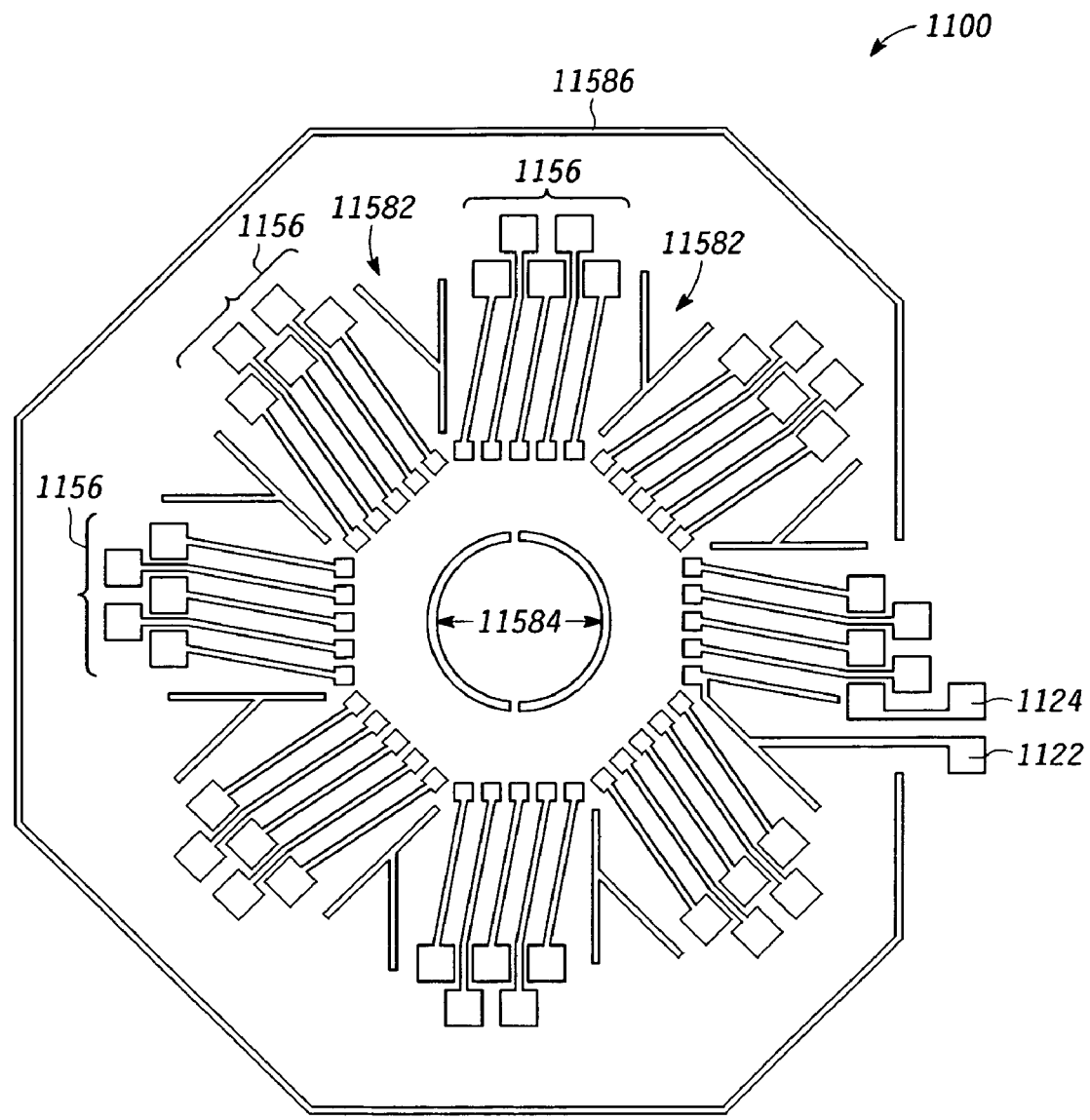
FIGS. 12 and 13 include illustrations of top views of a toroidal-shaped inductor after forming conductive traces in FIG. 12 and after attaching wires in FIG. 13.
Figure 13:
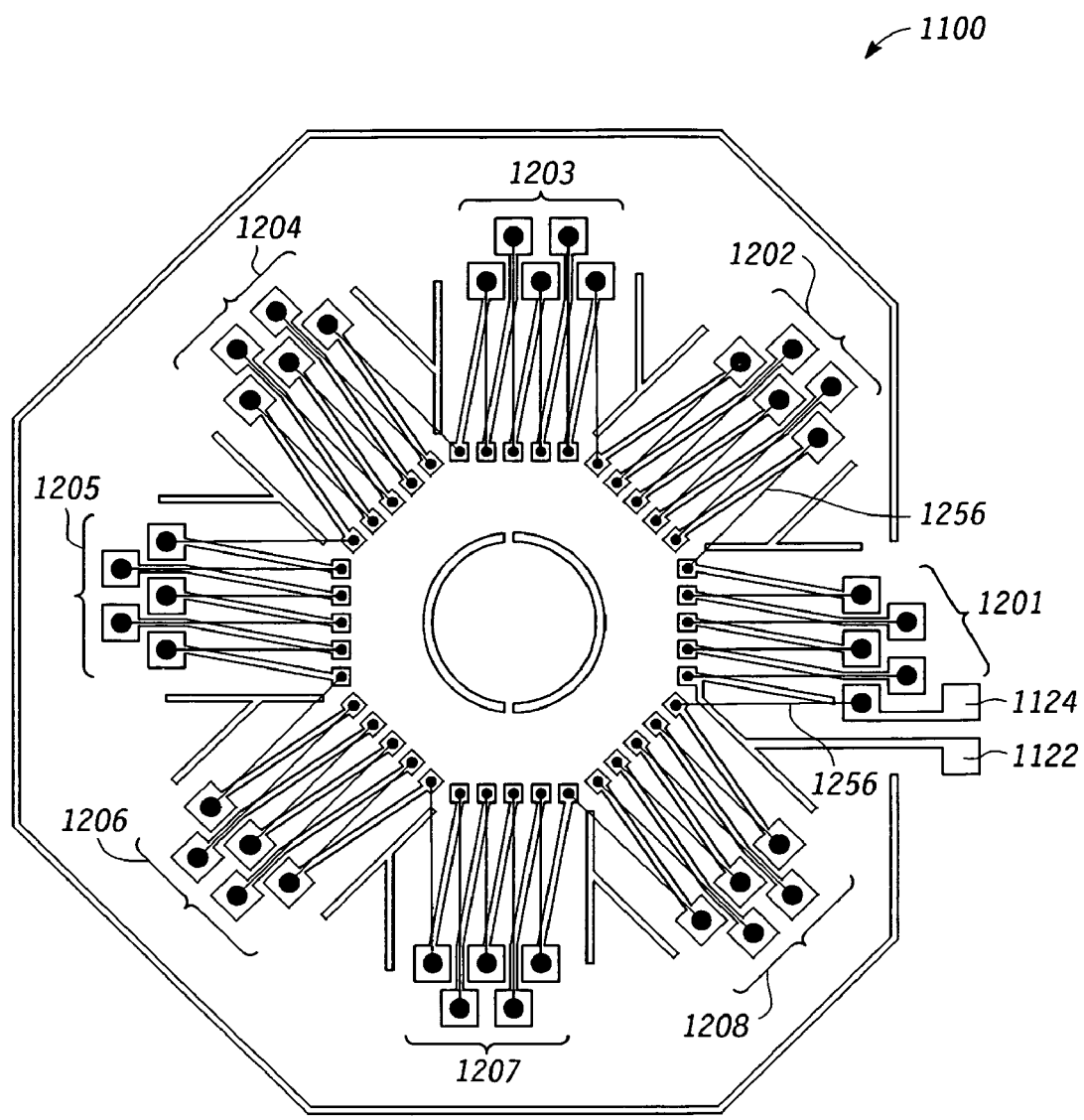

In another embodiment as illustrated in FIGS. 12 and 13, an electronic device includes a toroidal-shaped inductor 1100 formed from a plurality of linear inductor segments that are connected in series. Bonding pads, electronic components, and other features are not illustrated in FIGS. 12 and 13 to simplify understanding of the formation and shape of the toroidal-shaped inductor 1100. In one embodiment, conductive traces 1156 and RF shielding elements 11582, 11584, and 11586 have the shapes as illustrated in FIG. 12. One of the conductive traces 1156 has a via portion 1122 for the toroidal-shaped inductor 1100, and another of the conductive traces 1156 has another via portion 1124 for the toroidal-shaped inductor 1100. The via portion 1122, the via portion 1124, or any combination thereof, are electrically connected to a component within the electronic device, to a location external to the die substrate, or both. For the conductive traces 1156, the primary pad portions closer to the center of the toroidal-shaped inductor 1100 are smaller than the secondary pad portions further from the center. The size difference can be useful in allowing more processing margin during a subsequent wire-bond operation.

The RF shielding elements 11582 have a Y-shape, the RF shielding elements 11584 are substantially semi-circular, and the RF shielding element 11586 surrounds most of the toroidal-shaped inductor 1100. Other shapes and layout designs for RF shielding elements may be used with the toroidal-shaped inductor 1100. For example, the RF shielding elements 11584 may be replaced by an octagonal-shaped RF shielding element, the RF shielding element 11586 may surround substantially all of the conductive traces 1156, or the like. Any or all of the RF shielding elements 11582, 11584, or 11586 may electrically float or may be biased to a substantially constant voltage. Different voltages may be used for any two or more of RF shielding elements 11582, 11584, or 11586. Octagonal-shaped primary and secondary pad portions may replace the simpler square pads of toroidal-shaped inductor 1100. Octagon or another higher order polygon is a design approximation to circle. The resulting toroid can approximate a perfectly circular toroid, provide for single, uniform wire length and allow larger secondary pad portions without the staggered pad portion layout.

Wedge wire bonds can be formed at a smaller pitch when rectangular-shaped primary and secondary pad portions are used. For wedge bonders, changing bond angles slows down bonding speed. Rectangular pads can be designed to be eight linear segments arranged in an octagon-shaped toroid similar to FIG. 12. Thus, rather than having to rotate the die substrate or rotate bonder head after each wedge bond for circular toroid, at least 2, 3, 4 or more wires can be bonded before rotation. As illustrated in FIG. 13, 5 wires are bonded before having to rotate. The layout helps to shorten wire bonding time and increase equipment throughput. With rectangular pads for wedge wire bonds, the secondary pad portions are substantially the same size as primary pad portions, and therefore, there is no need to stagger the pads to achieve fine pitch pad design to achieve a smaller toroid size.

The conductive traces 1156 and RF shielding elements 11582, 11584, and 11586 may be formed using any of the embodiments previously described with respect to the conductive traces 52, 54, 56 and the RF shielding element 58.

Wires 1256 are attached to the conductive traces 1156 to substantially complete formation of the toroidal-shaped inductor 1100. The wires 1256 are attached using any of the embodiments as previously described for the wires 96 of the inductor 90 in FIGS. 8 and 9. For the conductive traces 1156, the primary bonds are made at the pad portions closer to the center of the toroidal-shaped inductor 1100, and the secondary bonds are made at the pad portions farther from the center. The toroidal-shaped inductor 1100 includes linear inductor segments 1201 through 1208 that are serially connected.

After reading this specification, skilled artisans will appreciate that other embodiments are possible. For example, the conductive traces 56 are not required. An inductor can be formed by bonding a wire 96 to the primary pad portion 524 and the secondary pad portion 542. The specification is not limited to wire bonding techniques in which the secondary bond is formed with significantly more force and stress compared to the primary bond. The concepts and designs described herein can also be used when the primary bond would be formed using more force or stress as compared to the secondary bond.

Embodiments as described herein can be used to provide benefits that overcome the problems with conventional structures and processes. The shock-absorbing layer 274 helps to reducing the likelihood of damaging underlying electronic components and interconnects during a wire-bond operation when forming an overlying inductor, and particularly when making the secondary bonds during wire bonding. Although not required, the shock-absorbing layer 274 may be formed over the uppermost inorganic insulating layer. If an uppermost inorganic layer would lie between the shock-absorbing layer 274 and the conductive traces 56, the subsequent wire bonding operation would have a significantly greater risk of fracturing such an uppermost inorganic insulating layer.

Additionally, the conductive traces 56, the conductive traces 1156, or any combination thereof can be significantly thicker than the bonding pads 12, the interconnect 14, and the interconnect 16. The additional thickness, particularly of a malleable material, such as copper or gold, can further help in absorbing shock during a wire bonding operation and reduce the likelihood of fracturing underlying inorganic insulating layers.

The layout of the inductor 90 and the toroidal-shaped inductor 1100 allow for a faster wire-bond operation. The toroidal-shaped inductor 1100 includes a plurality of conductive traces 1156 that are substantially parallel to each other. The layout can reduce the amount of rotation or two-dimensional movement between attaching wires for the inductor 90 or the toroidal-shaped inductor 1100.

The RF shield elements can help to reduce electromagnetic radiation from the inductor from reaching the die substrate 200, and therefore, lower resistivity substrates can be used.

Many different aspects and embodiments are possible. Some of those aspects and embodiments are described below. After reading this specification, skilled artisans will appreciate that those aspects and embodiments are only illustrative and do not limit the scope of the present invention.

In a first aspect, an electronic device can include a substrate, an interconnect level overlying the substrate, and a shock-absorbing layer overlying the interconnect level. The interconnect level can include a first interconnect and a second interconnect, the shock-absorbing layer can include a first opening over the first interconnect and a second opening over the second interconnect. The electronic device can also include a first inductor including conductive traces and at least one looped wire. The conductive traces can include a first conductive trace and a second conductive trace. A first via pad portion of the first conductive trace can extend to the first opening of the shock-absorbing layer and be electrically connected to the first interconnect, and a primary pad portion of the first conductive trace can overlie the shock-absorbing layer. A secondary pad portion of the second conductive trace can overlie the shock-absorbing layer, and a via portion of the second conductive trace can extend to the second opening of the shock-absorbing layer and be electrically connected to the second interconnect. A first looped wire of the at least one wire is attached to the primary pad portion of the first conductive trace. The first looped wire or a second looped wire of the at least one wire is attached to the secondary pad portion of the second conductive trace.

In one embodiment of the first aspect, the shock-absorbing layer includes an organic polymer. In another embodiment, the conductive traces include third conductive traces overlying the shock-absorbing layer, wherein each of the third conductive traces includes a primary pad portion and a secondary pad portion. One looped wire is bonded between the primary pad portions and the secondary pad portions of adjacent third conductive traces, wherein the third looped wires are bonded at areas overlying the shock-absorbing layer. In a particular embodiment, for each of the third conductive traces, the primary pad portion is smaller than the secondary pad portion. In a more particular embodiment, from a top view, the primary pad portions of the third conductive traces are oriented along a substantially straight line, and the secondary pad portions of the third conductive traces are oriented in a staggered formation.

In still another embodiment of the first aspect, the electronic device further includes an insulating layer overlying the interconnect level and underlying the shock-absorbing layer, wherein the insulating layer includes an inorganic material, and the insulating layer includes a third opening overlying the first interconnect and a fourth opening overlying the second interconnect. In a particular embodiment, the interconnect level further includes bonding pads, the insulating layer includes fifth openings overlying the bonding pads, and the shock-absorbing layer includes sixth openings overlying the bonding pads. In a more particular embodiment, the insulating layer abuts the first interconnect, the second interconnect, and the shock-absorbing layer, the shock-absorbing layer includes polyimide and abuts the conductive traces, and the conductive traces include an adhesion/barrier layer and a conductive layer. In another more particular embodiment, the bonding pads and the conductive traces include gold.

In a further embodiment of the first aspect, the electronic device further includes a radio-frequency shielding element adjacent to the first inductor, wherein the radio-frequency shielding element is in a form of a grid. In still a further embodiment, the first inductor is part of a toroidal-shape inductor.

In a second aspect, an electronic device can include a workpiece and a toroidal-shaped inductor overlying the workpiece. The toroidal-shaped inductor can include linear inductor segments that are connected in series, and the linear inductor segments include a first linear inductor segment having substantially parallel conductive traces and wires electrically connected between the substantially parallel conductive traces.

In one embodiment of the second aspect, the workpiece includes a shock-absorbing layer, and the substantially parallel conductive traces abut the shock-absorbing layer. In a particular embodiment, the shock-absorbing layer includes polyimide, and the substantially parallel conductive traces include an adhesion/barrier layer and a conductive layer. In another embodiment, the electronic device further includes a radio-frequency shielding element in a form of a grid. In still another embodiment, the substantially parallel conductive traces include gold.

In a third aspect, a process of forming an electronic device can include forming an interconnect level overlying a die substrate, wherein the interconnect level includes a first interconnect and a second interconnect. The process can also include forming a shock-absorbing layer overlying the interconnect level, and patterning the shock-absorbing layer to define a first opening that exposes the first interconnect and a second opening that exposes the second interconnect. The process can still further include forming conductive traces. The conductive traces can include a first conductive trace and a second conductive trace. A via portion of the first conductive trace can extend to the first opening of the shock-absorbing layer and be electrically connected to the first interconnect, and a primary pad portion of the first conductive trace can overlie the shock-absorbing layer. A secondary pad portion of the second conductive trace can overlie the shock-absorbing layer, and a via portion of the second conductive trace can extend to the second opening of the shock-absorbing layer and be electrically connected to the second interconnect. The process can yet further include attaching at least one wire to the conductive traces to form an inductor. A first wire of the at least one wire can be attached to the primary pad portion of the first conductive trace, and the first wire or a second wire of the at least one wire can be attached to the secondary pad portion of the second conductive trace.

In one embodiment of the third aspect, forming the shock-absorbing layer includes forming an organic polymer layer. In another embodiment, forming the conductive traces includes forming third conductive traces overlying the shock-absorbing layer, wherein each of the third conductive traces includes a primary pad portion and a secondary pad portion. The process also includes bonding third wire between the primary pad portions and the secondary pad portions of adjacent third conductive traces at areas overlying the shock-absorbing layer. In a particular embodiment, forming the third conductive traces includes forming the third conductive traces, wherein for each of the third conductive traces, the primary pad portion has a rectilinear shape, and the secondary pad portion has an octagonal shape.

In still another embodiment of the third aspect, forming the interconnect level includes forming bonding pads. The process further includes forming a passivation layer over the interconnect level and before forming the shock-absorbing layer, wherein the passivation layer includes an inorganic material, and patterning the passivation layer to define a third opening that exposes the first interconnect, a fourth opening that exposes the second interconnect, and fifth openings that expose the bonding pads. Patterning the shock-absorbing layer includes patterning the shock-absorbing layer to define sixth openings that expose the bonding pads. The process still further includes forming conductive pads over the bonding pads and attaching other wires between the conductive pads and a packaging substrate, wherein attaching the wires and attaching the other wires are performed during a same operating sequence.

In a further embodiment, forming the conductive traces includes forming a seed layer over the shock-absorbing layer and within the first opening and the second opening, forming a patterned layer over the seed layer, wherein the patterned layer includes third openings corresponding to a pattern for the conductive traces, forming a conductive layer over the seed layer within the third openings, removing the patterned layer to form exposed portions of the seed layer, and removing the exposed portions of the seed layer, wherein the conductive traces include remaining portions of the seed layer and the conductive layer. In another further embodiment, forming the conductive traces includes forming the conductive traces that include gold Note that not all of the activities described above in the general description or the examples are required. A portion of a specific activity may not be required, and that one or more further activities may be performed in addition to those described. Still further, the order in which activities are listed is not necessarily the order in which they are performed.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that a structural substitution, logical substitution, or another change may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

One or more embodiments of the disclosure may be referred to herein, individually or collectively, by the term "invention" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is provided to comply with 37 C.F.R. §1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed subject matter requires more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges includes each and every value within that range.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A process of forming an electronic device comprising:
   forming an interconnect level overlying a die substrate, wherein the interconnect level comprises a first interconnect and a second interconnect;
   forming a shock-absorbing layer overlying the interconnect level;
   patterning the shock-absorbing layer to define a first opening that exposes the first interconnect and a second opening that exposes the second interconnect;
   forming conductive traces, wherein:
      the conductive traces include a first conductive trace and a second conductive trace;
      a via portion of the first conductive trace extends to the first opening of the shock-absorbing layer and is electrically connected to the first interconnect, and a primary pad portion of the first conductive trace overlies the shock-absorbing layer; and
      a secondary pad portion of the second conductive trace overlies the shock-absorbing layer, and a via portion of the second conductive trace extends to the second opening of the shock-absorbing layer and is electrically connected to the second interconnect; and
   attaching at least one wire to the conductive traces to form an inductor, wherein:

a first wire of the at least one wire is attached to the primary pad portion of the first conductive trace; and
the first wire or a second wire of the at least one wire is attached to the secondary pad portion of the second conductive trace.

2. The process of claim 1, wherein forming the shock-absorbing layer comprises forming an organic polymer layer.

3. The process of claim 2, wherein forming the shock-absorbing layer comprises forming the shock-absorbing layer that includes polyimide.

4. The process of claim 2, wherein forming the conductive traces is performed after patterning the shock-absorbing layer and comprises:
forming a seed layer over the shock-absorbing layer and within the first opening and the second opening;
forming a patterned layer over the seed layer, wherein the patterned layer comprises third openings corresponding to a pattern for the conductive traces;
forming a conductive layer over the seed layer within the third openings;
removing the patterned layer to form exposed portions of the seed layer; and
removing the exposed portions of the seed layer, wherein the conductive traces include remaining portions of the seed layer and the conductive layer.

5. The process of claim 1, wherein:
forming the conductive traces comprises forming third conductive traces overlying the shock-absorbing layer, wherein each of the third conductive traces includes a primary pad portion and a secondary pad portion; and
attaching the at least one wire further comprises bonding third wires between the primary pad portions and the secondary pad portions of adjacent third conductive traces at areas overlying the shock-absorbing layer.

6. The process of claim 5, wherein forming the third conductive traces comprises forming the third conductive traces, wherein for each of the third conductive traces, the secondary pad portion is octagonal, and the primary pad portion has a shape other than octagonal.

7. The process of claim 1, wherein:
forming the interconnect level comprises forming bonding pads;
the process further comprises:
forming a passivation layer over the interconnect level and before forming the shock-absorbing layer, wherein the passivation layer includes an inorganic material;
patterning the passivation layer to define a third opening that exposes the first interconnect, a fourth opening that exposes the second interconnect, and fifth openings that expose the bonding pads;
patterning the shock-absorbing layer comprises patterning the shock-absorbing layer to define sixth openings that expose the bonding pads; and
the process further comprises:
forming conductive pads over the bonding pads; and
attaching other wires between the conductive pads and a packaging substrate, wherein attaching the wires and attaching the other wires are performed during a same operating sequence.

8. The process of claim 7, wherein forming the conductive traces comprises:
forming a seed layer over the shock-absorbing layer and within the first opening and the second opening;
forming a patterned layer over the seed layer, wherein the patterned layer comprises seventh openings corresponding to a pattern for the conductive traces;
forming a conductive layer over the seed layer within the seventh openings;
removing the patterned layer to form exposed portions of the seed layer; and
removing the exposed portions of the seed layer, wherein the conductive traces include remaining portions of the seed layer and the conductive layer.

9. The process of claim 1, wherein forming the conductive traces comprises forming the conductive traces that include gold.

10. The process of claim 1, wherein forming the interconnect level comprises forming bonding pads.

11. The process of claim 10, wherein further comprising:
forming a passivation layer over the interconnect level and before forming the shock-absorbing layer, wherein the passivation layer includes an inorganic material; and
patterning the passivation layer to define a third opening that exposes the first interconnect, a fourth opening that exposes the second interconnect, and fifth openings that expose the bonding pads.

12. The process of claim 10, wherein patterning the shock-absorbing layer comprises patterning the shock-absorbing layer to define third openings that expose the bonding pads.

13. The process of claim 10, further comprising:
forming conductive pads over the bonding pads; and
attaching other wires between the conductive pads and a packaging substrate.

14. The process of claim 13, wherein attaching the wires and attaching the other wires are performed during a same operating sequence.

15. The process of claim 1, wherein forming the conductive traces comprises forming the conductive traces such that the conductive traces abut the shock-absorbing layer.

16. The process of claim 1, wherein forming the shock-absorbing layer comprises forming the shock-absorbing layer that comprises polyimide.

17. The process of claim 16, wherein forming the conductive traces comprises forming the conductive traces that comprise an adhesion/barrier layer and a conductive layer.

18. The process of claim 1, wherein forming the conductive traces comprises forming the conductive traces that comprise an adhesion/barrier layer and a conductive layer.

19. The process of claim 1, further comprising forming a radio-frequency shielding element in a form of a grid.

20. The process of claim 19, wherein forming the radio-frequency shielding element is performed, such that from a top view of the workpiece, the radio-frequency shielding element surrounds the conductive traces.

* * * * *